United States Patent [19]
Narui et al.

[11] Patent Number: 5,111,469
[45] Date of Patent: May 5, 1992

[54] SEMICONDUCTOR LASER

[75] Inventors: Hironobu Narui; Hiroshi Yoshimatsu; Shoji Hirata; Masafumi Ozawa, all of Kanagawa; Yoshifumi Mori, Chiba, all of Japan

[73] Assignee: Sony Corporation, Tokyo, Japan

[21] Appl. No.: 566,824

[22] Filed: Aug. 14, 1990

[30] Foreign Application Priority Data

Aug. 15, 1989 [JP] Japan .................... 1-210382
Aug. 15, 1989 [JP] Japan .................... 1-212600

[51] Int. Cl.$^5$ ............................... H01S 3/19
[52] U.S. Cl. .......................... 372/46; 372/45
[58] Field of Search ..................... 324/45, 46

[56] References Cited

U.S. PATENT DOCUMENTS 4,366,569 12/1982 Hirao et al. ................. 372/46
4,496,403 1/1985 Turley ........................ 372/46
4,935,936 6/1990 Nelson et al. ................ 372/46

Primary Examiner—Georgia Epps
Attorney, Agent, or Firm—Hill, Van Santen, Steadman & Simpson

[57] ABSTRACT

A semiconductor laser comprises a semiconductor substrate provided in its major surface with a strip mesa, and a laminated structure constructed by sequentially forming, through the epitaxial deposition of semiconductor materials on the major surface of the semiconductor substrate, at least a first semiconductor layer serving as a first conduction type cladding layer, a second semiconductor layer serving as an active layer, a third semiconductor layer serving as a second conduction type cladding layer, and a fourth semiconductor layer serving as a light absorbing or current blocking layer by utilizing the crystallographic principle and the characteristics of the steps formed by the strip mesa so that faults are formed in the laminated structure so as to extend along the direction of extension of the opposite longitudinal side surfaces of the strip mesa. The second semiconductor layer is split by the faults so that a portion of the second semiconductor layer between the faults in a portion of the laminated structure extending on the strip mesa forms a strip active layer. The semiconductor layers are formed sequentially by a continuous metal organic chemical vapor deposition process at a growth rate not higher than about 4 Å/sec.

5 Claims, 11 Drawing Sheets

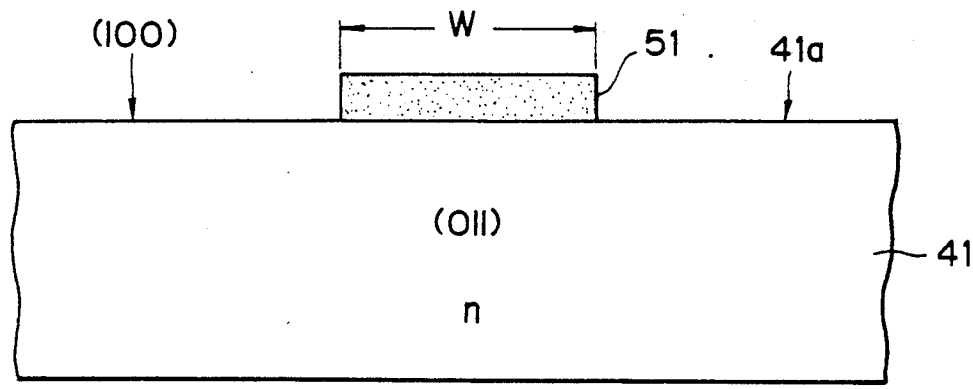
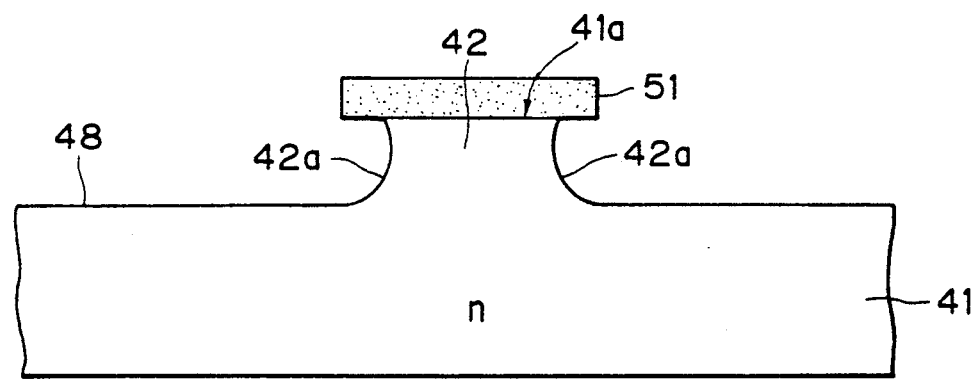
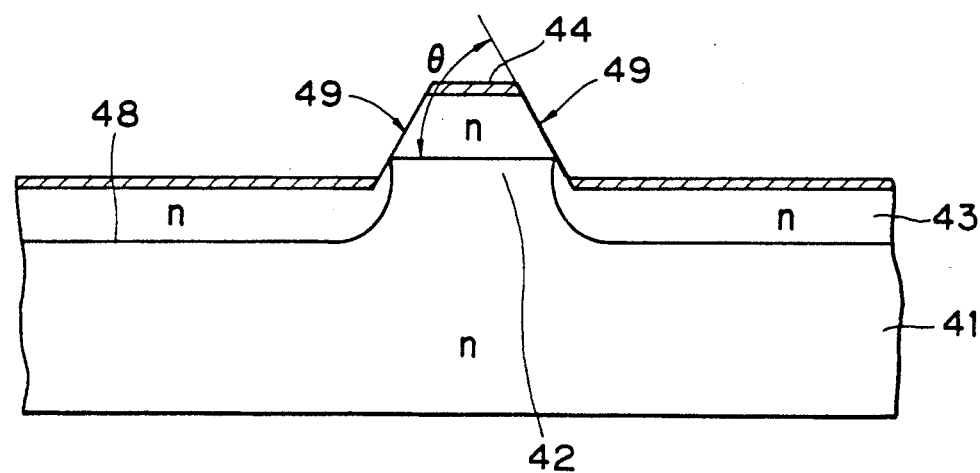

SEMICONDUCTOR LASER

BACKGROUND OF THE INVENTION

1. Field of the Invention

The present invention relates to a semiconductor laser, more specifically, to a self-oscillation laser (pulsation laser), and a method of growing crystals, such as aluminum mixed crystals, on a substrate having a stepped major surface.

2. Description of the Prior Art

Semiconductor lasers have been widely employed as light sources for the optical read/write operation with recording media like optical disks and magnetooptic disks. In recording information on or reading information from an optical recording medium, such as an optical disk or a magnetooptic disk, with a semiconductor laser, an inevitable small quantity of reflected light is returned from the optical recording medium or the optical system which produces reflected light noise due to interference with the laser beam to cause significant problems.

Such problems attributable to reflected light noise may be solved by employing a multimode semiconductor laser or a pulsation semiconductor laser, or by the fast modulation of the semiconductor laser.

As is generally known, a gain guide semiconductor laser incorporating a gain waveguide is capable of multimode oscillation. However, the thresho)d current $I_{th}$ of the gain guide semiconductor laser is very high, and such a very high threshold current $I_{th}$ is an impediment to increasing the output of the semiconductor laser for satisfactory operation in writing signal in and reading recorded signal from the magnetooptic recording medium or an optical disk by using the semiconductor laser as a light source. The fast modulation of the semiconductor laser requires a circuit of a complicated configuration.

Accordingly, the use of a self-pulsation (self-oscillation) laser is desirable to reduce the reflected light noise. The pulsation of the self-pulsation laser can be achieved by a first means that employs an intermediate construction between an index guide and a gain guide, a second means that employs a saturable (supersaturation) absorber or a third means that increases light expansion beyond current expansion. The first and second means are effective, in practical application, in controlling the pulsation, and increases the threshold current $I_{th}$.

To solve such problems, the applicant of the present patent application proposed a method of forming a buried heterostructure semiconductor laser in Japanese Patent Laid-open (Kokai) No. 61-183987. This method utilizes the dependence of epitaxial growth rate on the orientation of the crystal face in forming a semiconductor laser through a single, continuous process. This method forms semiconductor layers continuously and sequentially over the surface of a semiconductor substrate provided with a strip mesa by epitaxial growth to form a buried heterostructure semiconductor laser having a comparatively low threshold current $I_{th}$.

The applicant of the present patent application further proposed semiconductor lasers formed by utilizing the dependence of epitaxial growth rate on the orientation of the crystal face in Japanese Patent Laid-open (Kokai) Nos. 62-217829 and 63-330136. These semiconductor lasers incorporate improvements for simplifying the manufacturing process and further stabilizing the characteristics. FIG. 16 shows one of these previously proposed semiconductor lasers. As shown in FIG. 16, the semiconductor laser is formed by sequentially forming a first conduction type, for example, n-type, AlGaAs cladding layer 3, a low-impurity or undoped GaAs active layer 4, a first, second conduction type, for example p-type, AlGaAs cladding layer 5, a first conduction type, for example n-type, AlGaAs current blocking cladding layer 6, a second, second conduction type, for example, p-type, AlGaAs cladding layer 7 and a second conduction type cap layer 8 on the major surface 1a of a substrate 1, such as a GaAs compound semiconductor substrate, having the crystal face (100) and provided with a strip mesa 2 extending along the <011> crystallographic axis by a metal organic chemical vapor deposition (MOCVD) process.

First electrode 9 and a second electrode 10 are formed respectively over the cap layer 8 and the backside of the substrate 1 in ohmic contact. The n-type cladding layer 3, the first p-type cladding layer 5, the second p-type cladding layer 7 and the n-type current blocking layer 6 are formed of materials having a large bandgap, that is, a small refractive index, as compared with that of a material forming the active layer 4.

In depositing the materials in crystals by the epitaxial growth method, portions of the lower layers formed over the strip mesa 2 are superposed in a laminated structure having a triangular cross section, because, once the (111)B crystal face is formed by epitaxial growth on the strip mesa 2, the epitaxial growth rate of crystals on the (111)B crystal face drops below a few tenth of the epitaxial growth rate of crystals on other crystal face, for example the (100) crystal face, the epitaxial growth of crystals on the (111)B crystal face barely continues and the (111)B crystal face forms a fault. Thus, the relation with the orientation of the crystal face of the strip mesa 2 of the substrate 1 is specified, the shape and size of the strip mesa 2 are determined selectively and the respective thicknesses of the layers 3 to 6 are determined selectively to form a strip of the active layer 4 between the cladding layers 3 and 5 formed on the strip mesa 2 between inclined side surfaces 11 of the (111)B crystal face inclined at about 55° so that the strip of the active layer 4 is separated from other portion of the active layer 4, and to form the current blocking layer 6 contiguously with the side edges of the strip of the active layer 4, hence, the inclined side surfaces 11, in mesa grooves 12.

Since the strip of the active layer 4 formed on the strip mesa 2 is surrounded by the current blocking layer 6, the semiconductor laser having a low threshold current $I_{th}$ can be fabricated through a single cycle of continuous epitaxial growth process.

The semiconductor laser thus formed by the aluminum mixed crystals grown by epitaxial growth through the MOCVD process, however, has problems that depressions or irregularities are formed at some positions in a portion of the electrode 9 corresponding to the strip mesa 2 and that the laser beam does not oscillate, the oscillating efficiency is low and the characteristics is unstable when such depressions or irregularities are formed in the electrode 9.

It is known that the epitaxial growth rate increases sharply with increase in the aluminum content of the aluminum mixed crystals. The inventor of the present invention have found through studies that the deterioration of the characteristics of the semiconductor laser is more or less attributable to the epitaxial growth rate.

For example, an aluminum oxide is deposited across the strip of the epitaxial semiconductor layer formed separate from other portion of the same epitaxial semiconductor layer on the strip mesa 2 forming depressions or irregularities in the electrode 9 and impeding current concentration on the active layer 4 or intercepting current. Such depressions or irregularities make the semiconductor laser unacceptable and cause problems such as the deterioration or fluctuation of the characteristics.

SUMMARY OF THE INVENTION

Accordingly, it is an object of the present invention to provide a semiconductor laser capable of suppressing noise attributable to reflected light and positively generating a pulsating laser beam Another object of the present invention is to provide a method of growing crystals in manufacturing a semiconductor laser, capable of forming a semiconductor laser having excellent, stable characteristics to enable the semiconductor manufacturing process to manufacture semiconductor lasers at a high yield rate.

A semiconductor laser in accordance with the present invention is fabricated through the epitaxial deposition of at least a first semiconductor layer serving as a first conduction type cladding layer, a second semiconductor layer serving as an active layer, a third semiconductor layer serving as a second conduction type cladding layer, and a fourth semiconductor layer, on the major surface of a semiconductor substrate having a strip mesa in the major surface by utilizing the crystallographic principle and the characteristics of steps formed by the strip mesa so that faults are formed in a laminated structure of the semiconductor layers so as to extend along the direction of extension of the opposite, longitudinal side surfaces of the strip mesa. The second semiconductor layer is split by the faults so that a portion of the second semiconductor layer between the faults in a portion of the laminated structure extending on the strip mesa forms a strip active layer.

In a first aspect of the present invention, a portion of the strip mesa is expanded widthwise to form an expanded portion, and the fourth semiconductor layer is used as a light absorbing layer. The fourth semiconductor layer is split by the faults so that a portion of the fourth semiconductor layer in the epitaxial layers corresponding to a portion of the strip mesa having a desired width is omitted and the fourth semiconductor layer, i.e., the light absorbing layer is formed on the active layer on the opposite sides of the epitaxial layers on the expanded portion of the strip mesa to form a local, low-excitation region, namely, a saturable or supersaturating absorbing portion, for pulsation, i.e., self-oscillation.

In a second aspect of the present invention, a portion of the strip mesa is contracted widthwise to form a contracted portion and the fourth semiconductor layer is used as a current blocking layer. The fourth semiconductor layer is split by the faults so that a portion of the fourth semiconductor layer formed on the active layer corresponding to a portion of the strip mesa having a desired width is omitted and the fourth semiconductor layer serving as a current blocking layer is formed across the epitaxial layers on the contracted portion of the strip mesa to form a portion which allows carrier injection into the active layer scarcely, i.e., a saturable or supersaturating absorbing portion, for pulsation.

In a third aspect of the present invention, a portion of the strip mesa is expanded to form an expanded portion, and the fourth semiconductor layer is used as a current blocking layer. The fourth semiconductor layer is split by the faults so that the edges of the split fourth semiconductor layer are contiguous with the opposite end surfaces of a portion of the active layer on the strip mesa, a portion of the fourth semiconductor layer corresponding to a portion of the strip mesa having a desired width is omitted and a portion of the fourth semiconductor layer serving as a current blocking layer is formed on the third semiconductor layer formed on the active layer in the epitaxial layers on the expanded portion of the strip mesa to form a saturable or supersaturating portion for pulsation, i.e., self oscillation.

In a fourth aspect of the present invention, auxiliary ridges having a height smaller than the strip mesa are formed on the opposite sides of a portion of the strip mesa and the fourth semiconductor layer is used as a light absorbing or current blocking layer. The fourth semiconductor layer is split by the faults so that a portion of the fourth semiconductor layer in the layers formed by epitaxial growth on a portion of the strip mesa having a desired width is omitted and portions of the fourth semiconductor layer extending from portions of the epitaxial layers corresponding to the auxiliary ridges over a portion of the epitaxial layers between the auxiliary ridges are formed opposite to each other on the active layer to form a saturable or supersaturating portion for pulsation by forming a local area for suppressing carrier injection into the light absorbing or active layer.

BRIEF DESCRIPTION OF THE DRAWINGS

The above and other objects, features and advantages of the present invention will become more apparent from the following description taken in connection with the accompanying drawings, in which:

FIGS. 14A to 14f are enlarged, schematic sectional views of a semiconductor laser in different stages of a semiconductor laser manufacturing method in a fifth embodiment according to the present invention;

DETAILED DESCRIPTION OF THE PREFERRED EMBODIMENTS

Figure 1:
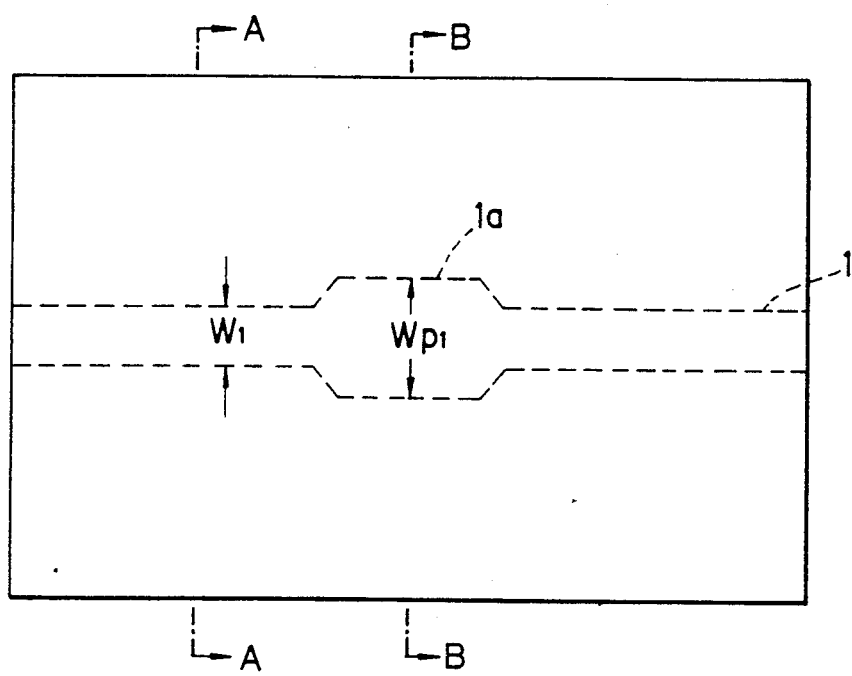
FIG. 1 is an enlarged, schematic plan view of a semiconductor laser in a first embodiment according to the present invention.
Figure 2:
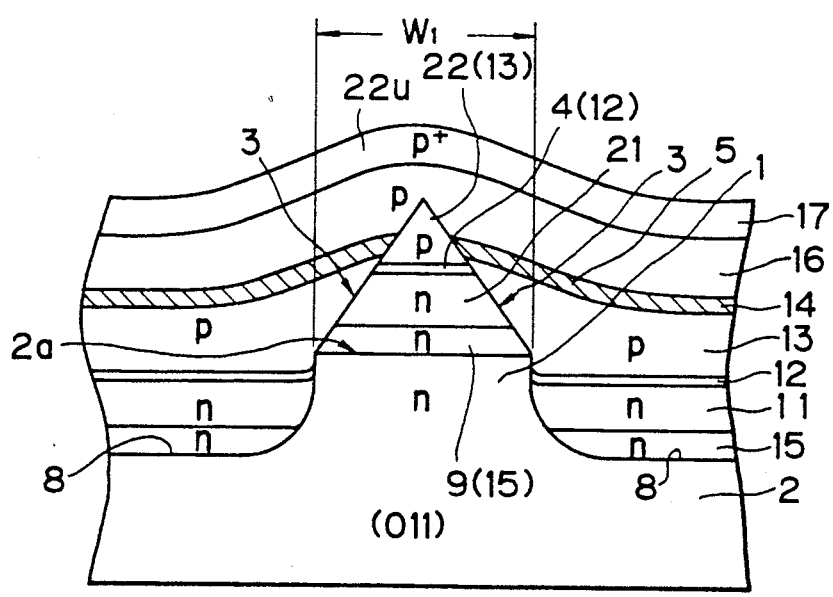
FIG. 2 is an enlarged sectional view taken on line A—A in FIG. 1.
Figure 3:
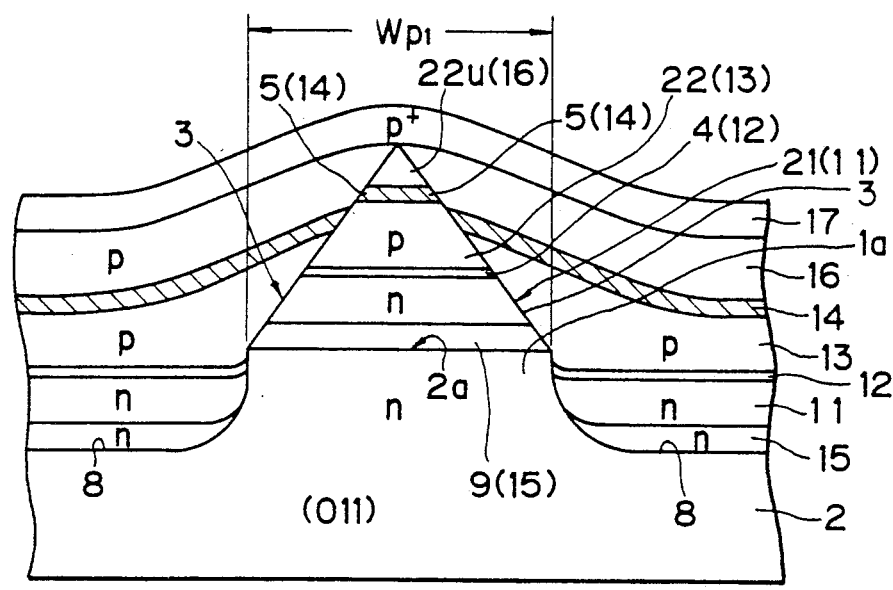
FIG. 3 is an enlarged sectional view taken on line B—B in FIG. 1.

First Embodiment (FIGS. 1, 2, 3)

Referring to FIGS. 1, 2 and 3, a semiconductor laser in a first embodiment according to the present invention employs a semiconductor substrate 2 provided with a strip mesa 1 of a desired width $W_1$ having an expanded portion 1a of a width $W_{p1}$ on its major surface. Sequentially formed by epitaxial growth on the major surface of the semiconductor substrate 2 are epitaxial layers including at least a first semiconductor layer 11 (first conduction type cladding layer), a second semiconductor layer 12 (active layer), a third semiconductor layer 13 (second conduction type cladding layer) and a fourth semiconductor layer 14 (first or second conduction type light absorbing layer). Faults 3 are formed in the epitaxial layers along the longitudinal, opposite sides of the strip mesa 1. The second semiconductor layer 12 among the epitaxial layers is split by the faults 3 to form a strip active layer 4, the fourth semiconductor layer 14 is split by the faults 3 to omit the fourth semiconductor layer 14 from a laminated structure of the epitaxial layers formed on the expanded portion 1a of the strip mesa 1 as shown in FIG. 2, and a portion of the semiconductor layer 14 among the portion of the epitaxial layers, serving as a strip light absorbing layer 5 is formed over the strip active layer 4.

Figure 4:
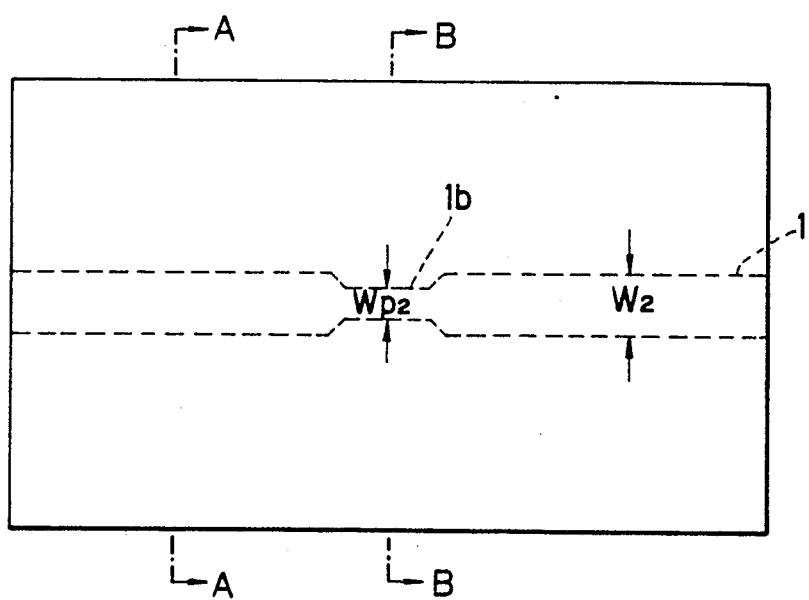
FIG. 4 is an enlarged, schematic plan view of a semiconductor laser in a second embodiment according to the present invention.
Figure 5:
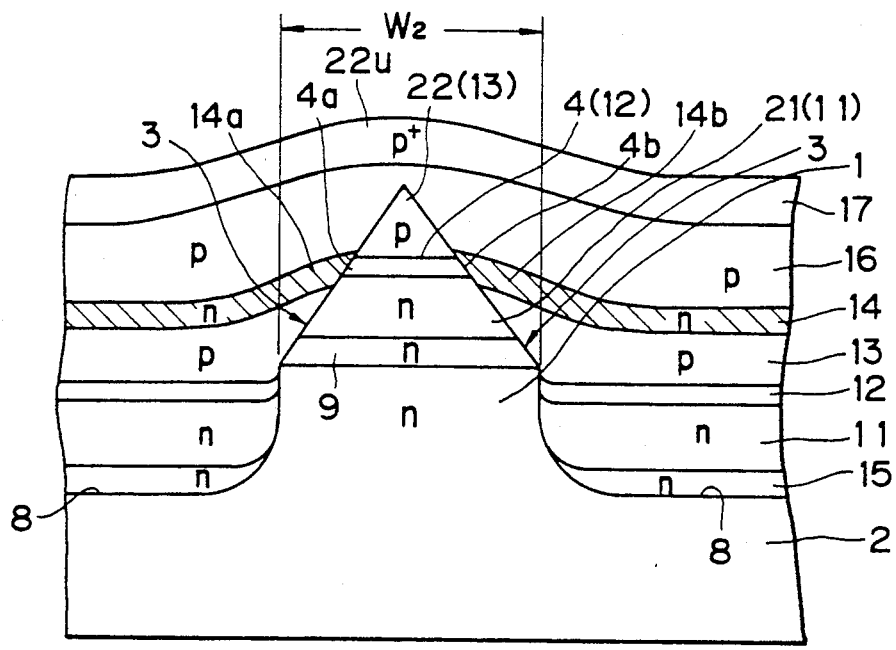
FIG. 5 is an enlarged sectional view taken on line A—A in FIG. 4.
Figure 6:
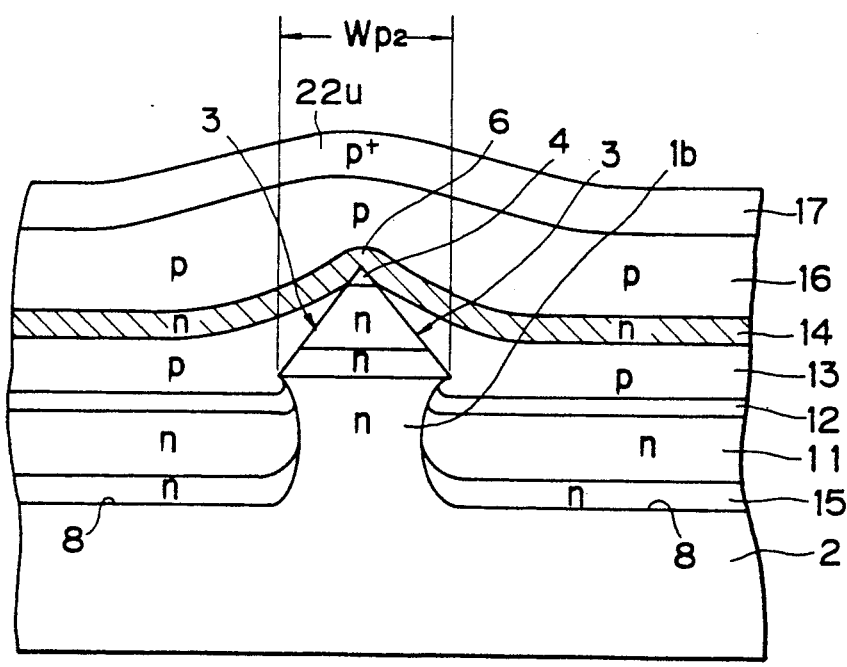
FIG. 6 is an enlarged sectional view taken on line B—B in FIG. 4.

Second Embodiment (FIGS. 4, 5, 6)

Referring to FIGS. 4, 5 and 6, a semiconductor laser in a second embodiment according to the present invention employs a semiconductor substrate 2 provided with a strip mesa 1 of a desired width $W_2$ having a contracted portion 1b of a width $W_{p2}$ on its major surface. Sequentially formed by epitaxial growth on the major surface of the semiconductor substrate 2 are epitaxial layers including at least a first semiconductor layer 11 (first conduction type cladding layer), a second semiconductor layer 12 (active layer), a third semiconductor layer 13 (second conduction type cladding layer), and a fourth semiconductor layer 14 (first conduction type current blocking layer). Faults 3 are formed in the epitaxial layers along the longitudinal, opposite sides of the strip mesa 1. The second semiconductor layer 12 among the epitaxial layers is split by the faults 3 to form a strip active layer 4, and a portion of the fourth semiconductor layer 14 in the epitaxial layers corresponding to the portion of the desired width $W_2$ of the strip mesa 1 is split so that the fourth semiconductor layer 14 is not formed over the strip active layer 4 in a portion of the laminated structure of the epitaxial layers formed on the portion of the desired width $W_2$ of the strip mesa 1 as shown in FIG. 5, and a portion of the second semiconductor layer 14 in a portion of the laminated structure of the epitaxial layers formed on the contracted portion 1b of the strip mesa 1 extend across the contracted portion 1b of the strip mesa 1 to form a current blocking layer 6 over the strip active layer 4 as shown in FIG. 6.

Figure 7:
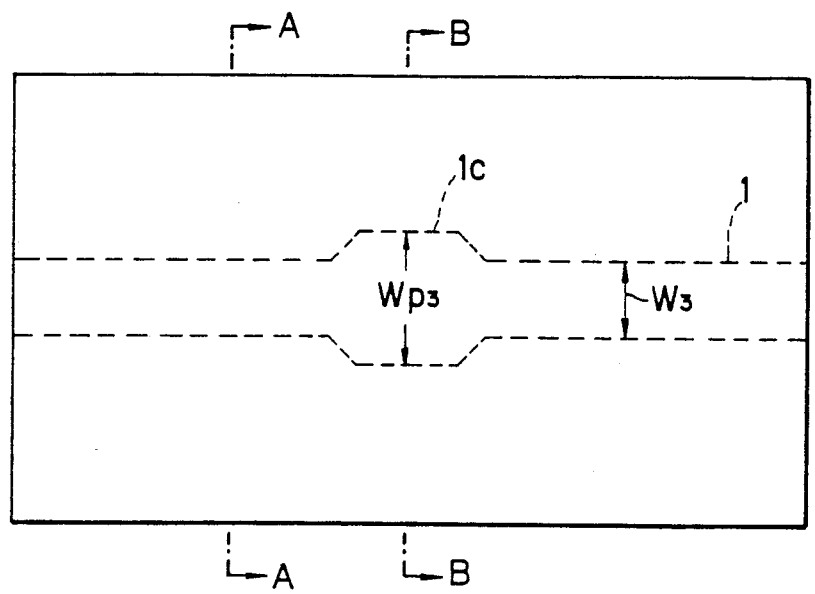
FIG. 7 is an enlarged, schematic plan view of a semiconductor laser in a third embodiment according to the present invention.
Figure 8:
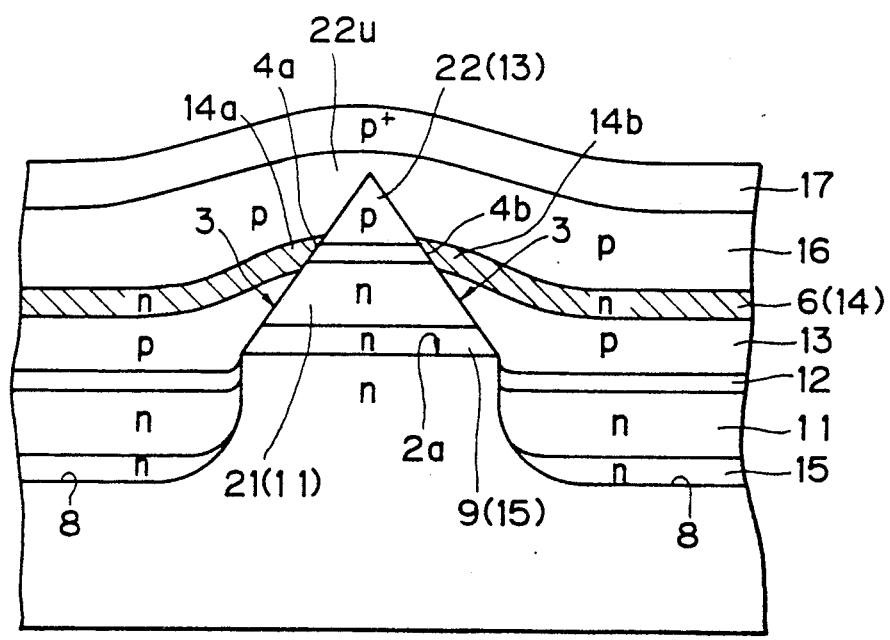
FIG. 8 is an enlarged sectional view taken on line A—A in FIG. 7.
Figure 9:
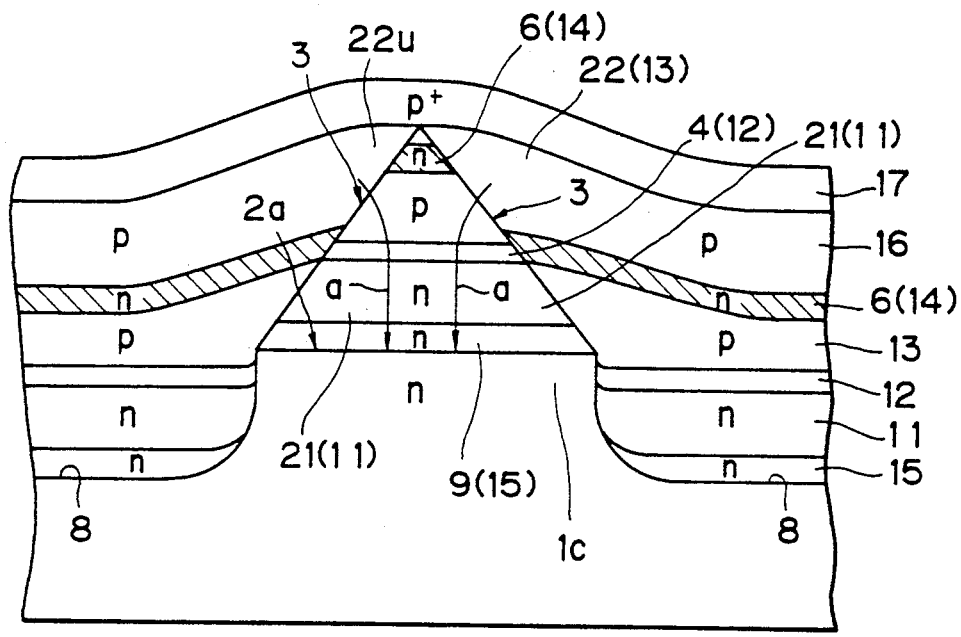
FIG. 9 is an enlarged sectional view taken on line B—B in FIG. 7.

Third Embodiment (FIGS. 7, 8, 9)

Referring to FIGS. 7, 8 and 9, a semiconductor laser in a third embodiment according to the present invention employs a semiconductor substrate 2 provided with a strip mesa 1 of a desired width $W_3$ having an expanded portion 1c of a width $W_{p3}$ on its major surface. Sequentially formed by epitaxial growth on the major surface of the semiconductor substrate 2 are epitaxial layers including at least a first semiconductor layer 11 (first conduction type cladding layer), a second semiconductor layer 12 (active layer), a third semiconductor layer 13 (second conduction type cladding layer) and a fourth semiconductor layer 14 (first conduction type current blocking layer). Faults 3 are formed in the epitaxial layers along the longitudinal, opposite sides of the strip mesa 1. The second semiconductor layer 12 among the epitaxial layers is split by the faults 3 to form a strip active layer 4, the fourth semiconductor layer 14 is split by the faults 3 so that the edges 14a and 14b of the fourth semiconductor layer 14 are contiguous with the opposite side edges 4a and 4b or the vicinities of the opposite side edges 4a and 4b of the strip active layer 4 formed over the strip mesa 1, a portion of the fourth semiconductor layer 14 in a portion of the laminated structure of the epitaxial layers formed on the portion of the desired width $W_3$ of the strip mesa 1 is omitted as shown in FIG. 8, and a portion of the fourth semiconductor layer 14 in a portion of the laminated structure of the epitaxial layers formed on the expanded portion 1c of the width $W_{p3}$ of the strip mesa 1 is formed locally on the third semiconductor layer 13 formed on the strip active layer 4 to form a strip current blocking layer 6 as shown in FIG. 9.

Fourth Embodiment (FIGS. 10, 11, 12, 13)

Figure 10:
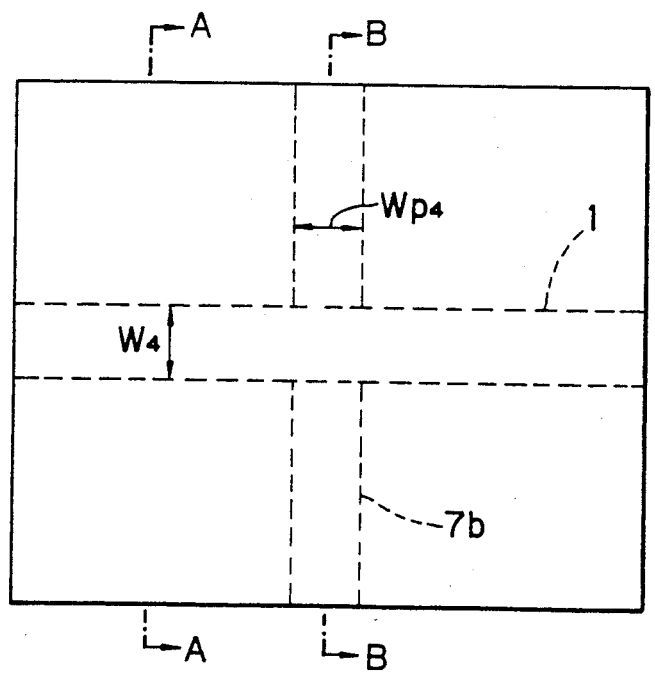
FIG. 10 is an enlarged, schematic plan view of a semiconductor laser in a fourth embodiment according to the present invention.
Figure 11:
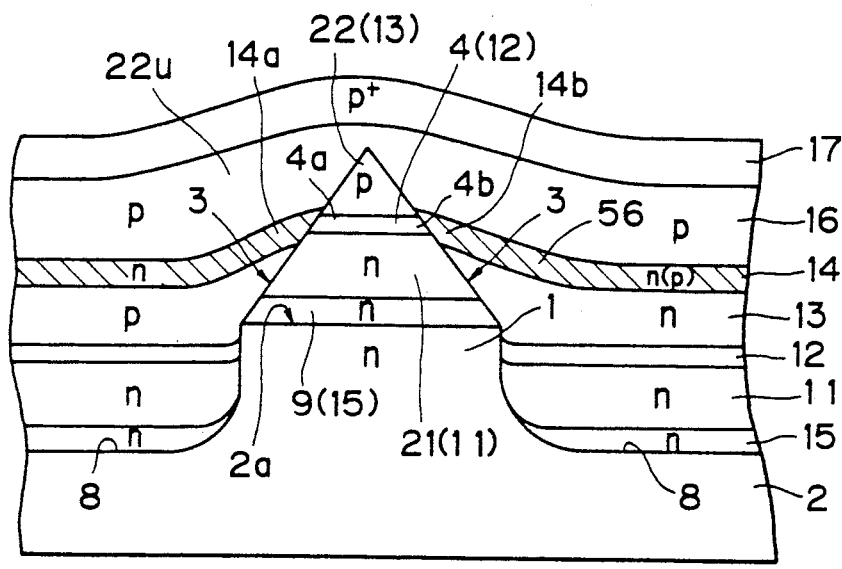
FIG. 11 is an enlarged sectional view taken on line A—A in FIG. 10.
Figure 12:
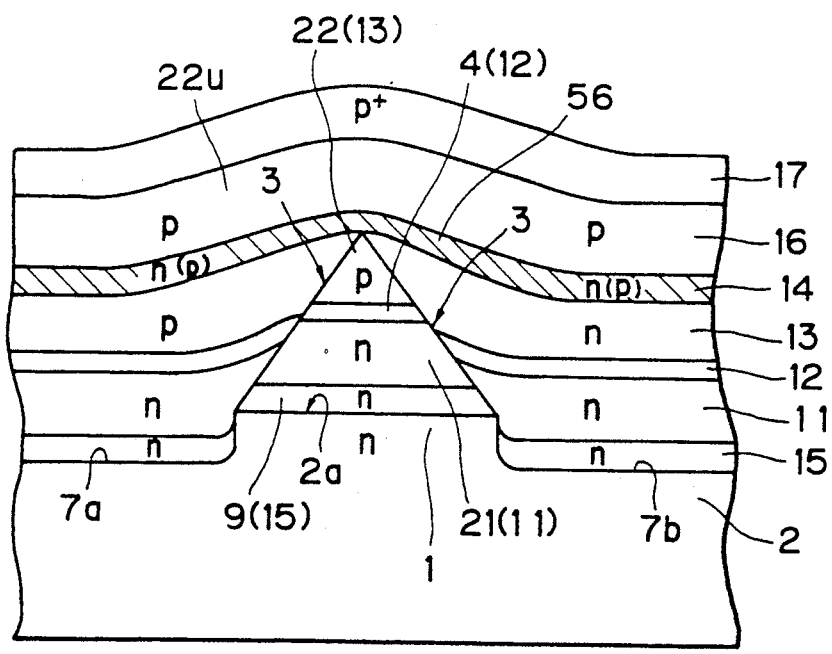
FIG. 12 is an enlarged sectional view taken on line B—B in FIG. 10

Referring to FIGS. 10, 11, 12 and 13, a semiconductor laser in a fourth embodiment according to the present invention employs a semiconductor substrate 2 provided in its major surface with a strip mesa of a desired width $W_4$, and auxiliary strip mesas 7a and 7b of a desired height lower than that of the strip mesa 1, extending respectively on the opposite sides of a portion of the strip mesa 1. Sequentially formed by epitaxial growth on the major surface of the semiconductor substrate 2 are a first semiconductor layer 11 (first conduction type cladding layer), a second semiconductor layer 12 (active layer), a third semiconductor layer 13 (second conduction type cladding layer) and a fourth semiconductor layer 14 (light absorbing or current blocking layer). Faults 3 are formed in the epitaxial layers along the longitudinal, opposite sides of the strip mesa 1. The second semiconductor layer 12 among the epitaxial layers is split by the faults 3 to form a strip active layer 4 on the strip mesa 1, the fourth semiconductor layer 14 among the epitaxial layers is split by the faults 3 so that a portion of the fourth semiconductor layer 14 corresponding to a portion of the strip mesa 1 other than a portion of the same between the auxiliary strip mesas 7a and 7b is omitted as shown in FIG. 11, and a portion of the fourth semiconductor layer 14 extending over the auxiliary strip mesas 7a and 7b extends across the portion of the strip mesa 1 between the auxiliary strip mesas 7a and 7b to form a current blocking layer 56 over the strip active layer 4 as shown in FIG. 12.

The epitaxial layers are formed by a continuous epitaxial process so that the faults 3 are formed along the opposite, longitudinal sides of the strip mesa 1 by a MOCVD method disclosed previously in Japanese Patent Laid-open (Kokai) No. 61-183987, which utilizes the dependence of epitaxial growth rate on the orientation of the crystal face, and the effect of the strip mesa 1.

As shown in FIG. 3, the semiconductor laser in the first embodiment has the light absorbing layer strip 5 formed over a portion of the strip active layer 4 included in the epitaxial layers formed on the expanded portion 1a of the strip mesa 1. Accordingly, a local, low-excitation region, namely, a saturable (supersaturation) region, is formed in the strip active layer 4 for pulsation.

As shown in FIG. 6, the semiconductor laser in the second embodiment has the light blocking layer strip 6 formed over a portion of the strip active layer 4 included in the epitaxial layers formed on the contracted portion 1b of the strip mesa 1. Accordingly, the flow of current through a portion of the strip active layer 4 is intercepted to suppress the injection of carriers into a portion of the strip active layer 4 to form a saturable (supersaturation) absorbing portion in the strip active layer 4 due to the reduction of gain.

As shown in FIG. 9, the semiconductor laser in the third embodiment has the current blocking layer 6 are formed contiguously with the opposite side edges 4a and 4b of the strip active layer 4, and a portion of the current blocking layer 6 is included in the epitaxial layers formed on the expanded portion 1c of the strip mesa 1. Accordingly, a current flows through restricted gaps in the current blocking layer 6 as indicated by arrows a in the epitaxial layers on the expanded portion 1c of the strip mesa 1 to suppress the injection of carriers in a region for pulsation.

As shown in FIGS. 10 to 13, the semiconductor laser in the fourth embodiment according to the present invention is provided with the auxiliary strip mesas 7a and 7b having a height lower than that of the strip mesa 1 and extended on the opposite sides of a portion of the strip mesa 1. Accordingly, the light absorbing or current blocking layer extends across a portion of the active layer strip in the portion of the strip mesa between the auxiliary strip mesas 7a and 7b to form a saturable (supersaturation) absorbing region in part of the strip active layer 4 for pulsation.

Fifth Embodiment (FIGS. 14A to 14F, 15)

A semiconductor laser manufacturing method in a fifth embodiment according to the present invention will be described hereinafter with reference particularly to FIGS. 14A to 14F as applied to manufacturing a semiconductor laser of a III-V compound of an AlGaAs group.

Referring to FIG. 14A, a semiconductor substrate 41 of an n-type GaAs compound a major surface 41a of the (100) crystal face. An etching mask 51 of a desired width W is formed over a selected area on the major surface 41a of the semiconductor substrate 41. The etching mask 51 having the shape of a strip is formed by the photographic processing of photoresist film formed over the major surface 41a. In FIG. 14A, the (001) crystal face extends along the sheet, and the strip-shaped etching mask 51 extends along the <011> crystallographic axis perpendicular to the (001) crystal face.

Then, the major surface 41a of the semiconductor substrate 41 is subjected to a crystallographic etching process using a sulfuric acid etchant prepared by mixing 3 parts of $H_2SO_4$, 1 part of $H_2O_2$ and 1 part of $H_2$ to etch areas of the major surface 41a other than the area covered with the etching mask 51 in recesses 48 so that a strip mesa 42 having opposite side surfaces having the shape of a smooth, concave curve as shown in FIG. 14B.

Subsequently, as shown in FIG. 14C, the etching mask 51 is removed, an n-type buffer layer, not shown, is formed, if need be, over the stepped major surface 41a of the semiconductor substrate 41 by a MOCVD process, and then an n-type $Al_xGa_{1-x}As$ is grown by epitaxial growth to form a first conduction type cladding layer 43. With the progress of epitaxial growth, slopes 49 of the (111)B crystal face inclined at an angle $\theta$ of about 55° to the (100) crystal face are formed naturally on the opposite sides of the cladding layer 43 formed on the top surface of the strip mesa 42. When the slopes 49 of the (111)B crystal face are formed, the epitaxial growth of the n-type cladding 7 layer 43 is stopped. Subsequently, an undoped $Al_yGa_{1-y}As$ is deposited by the MOCVD process over the n-type cladding layer 43 including a portion of the n-type cladding layer 43 formed on the top surface of the strip mesa 42 and having a trapezoidal cross section to form an epitaxial active layer 44.

Since the MOCVD process is scarcely able to form epitaxial layers over the (111)B crystal faces of the slopes 49, the epitaxial active layer 44 is formed scarcely over the slopes 49 and is formed over the top surface of the strip mesa 42 and on the bottom surface of the recesses 48 extending around the strip mesa 42.

Figure 14D:
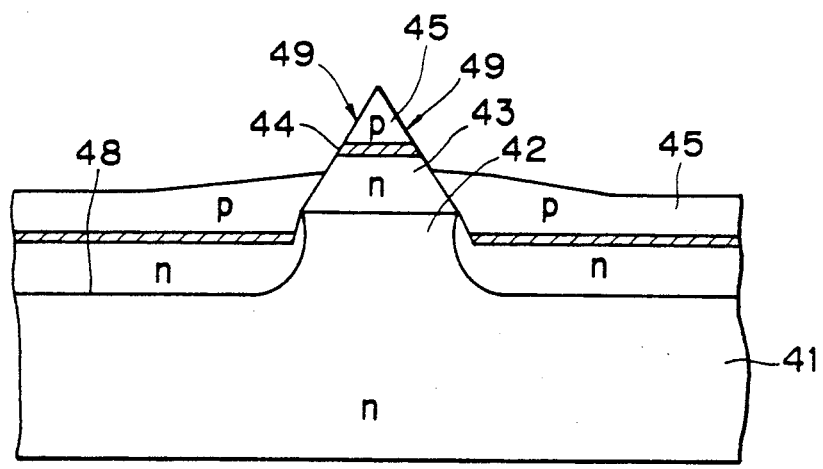

Subsequently, a p-type $Al_xGa_{1-x}As$ is deposited by the MOCVD process over the n-type cladding layer 43 to form an epitaxial first p-type (second conduction type) cladding layer 45. The MOCVD process is continued until the opposite side surfaces of the p-type cladding layer 45 formed over the strip mesa 42 intersect each other to form the extensions of the slopes 49, and the lower halves of the slopes 49 of the n-type cladding layer 43 are buried in the p-type cladding layer 45 formed over the active layer 44 formed in areas corresponding to the recesses 48 as shown in FIG. 14D.

Figure 14E:
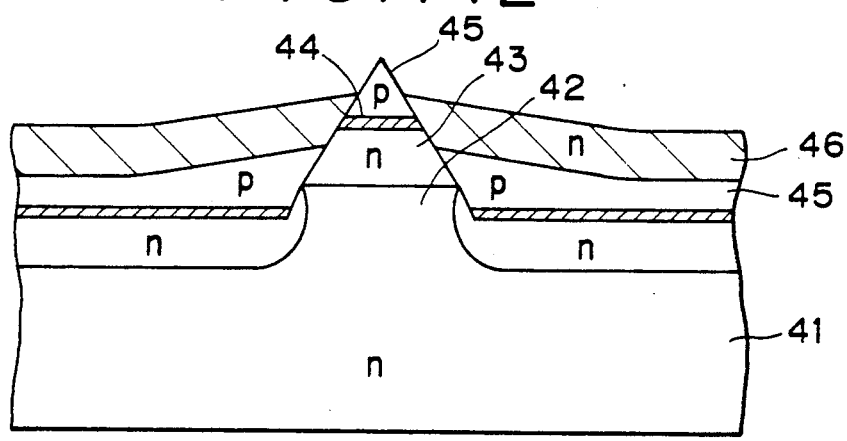

Then, as shown in FIG. 14E, an n-type $Al_xGa_{1-x}As$ of the same composition as that of the n-type $Al_xGa_{1-x}As$ forming the n-type cladding layer 43 is deposited by the MOCVD process to form an epitaxial current blocking layer 46. In forming the current blocking layer 46, the thickness of the current blocking layer is controlled so that the slopes 49 of the active layer 44 formed over the strip mesa 42 are buried completely in the current blocking layer 46, and the portion of the p-type cladding layer 45 formed over the strip mesa 42 and the portions of the same formed over the recess 48 are separated by the current blocking layer 46.

Figure 14F:
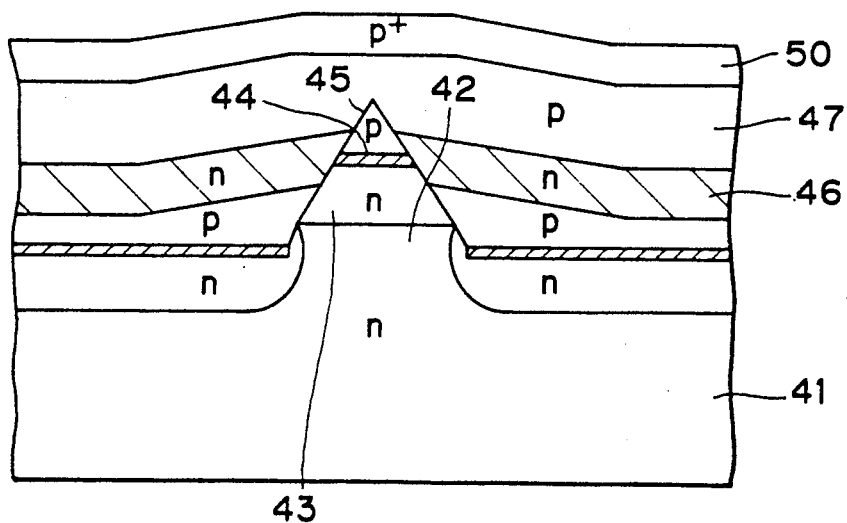

Then, as shown in FIG. 14F, a p-type $Al_xGa_{1-x}As$ of the same composition as that of the p-type $Al_xGa_{1-x}As$ forming the first cladding layer 45 and a highly doped p-type (second conduction type) GaAs are deposited sequentially by the MOCVD process to form an epitaxial second cladding layer 47 and an epitaxial cap layer 50, respectively. Although the second p-type cladding layer 47 does not grow over the slopes 49 in the initial stage of the MOCVD process, the second p-type cladding layer 47 grows over the entire exposed surface including the slopes 49 as crystal faces other than the (111)B crystal face are formed at the junctions of the slopes and the second p-type cladding layer 47. The cap layer 50 is formed over the entire surface of the second p-type cladding layer 47.

Finally, a first electrode 51 and a second electrode 52 are formed respectively on the cap layer 50 and the backside of the semiconductor substrate 41 in ohmic contact to complete the semiconductor laser.

The layers 43, 44, 45, 46, 47 and 50 are formed sequentially through a single continuous MOCVD process simply by changing the source gases.

Figure 15:
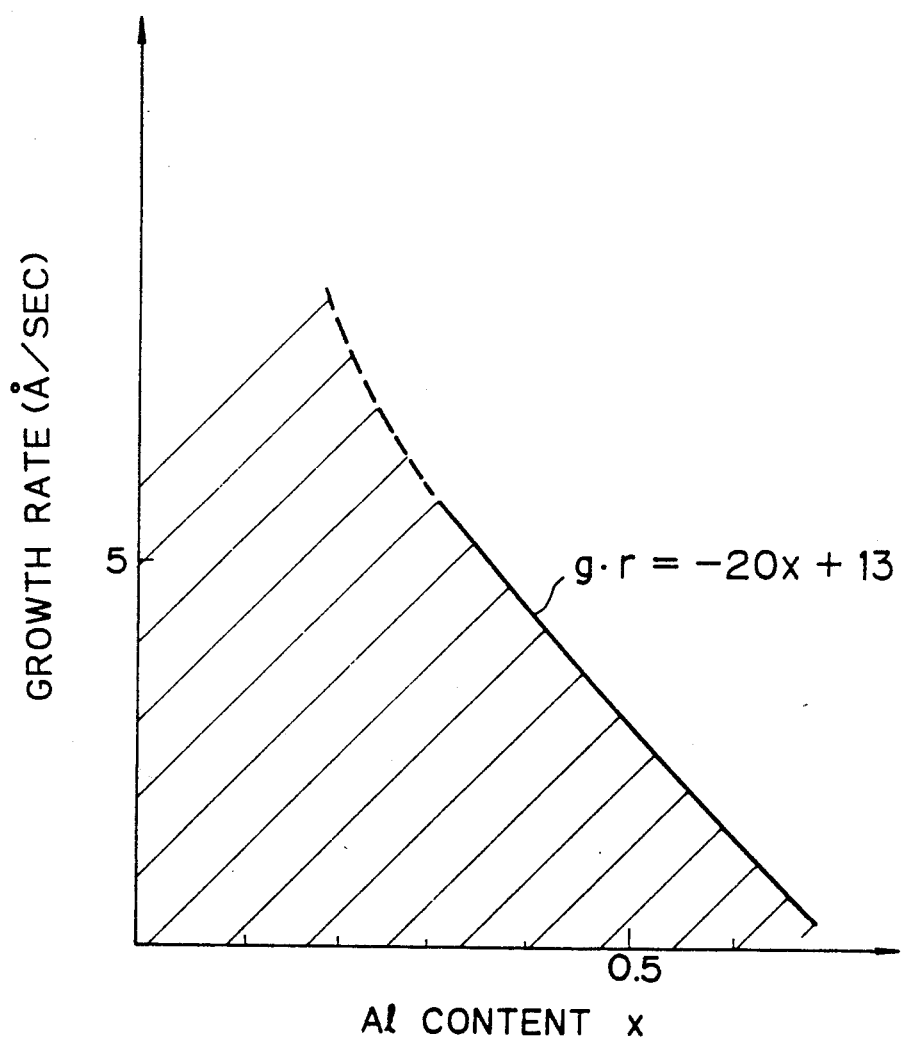
FIG. 15 is a graph showing the relation between aluminum content and crystal growth rate to avoid defect formation.
Figure 16:
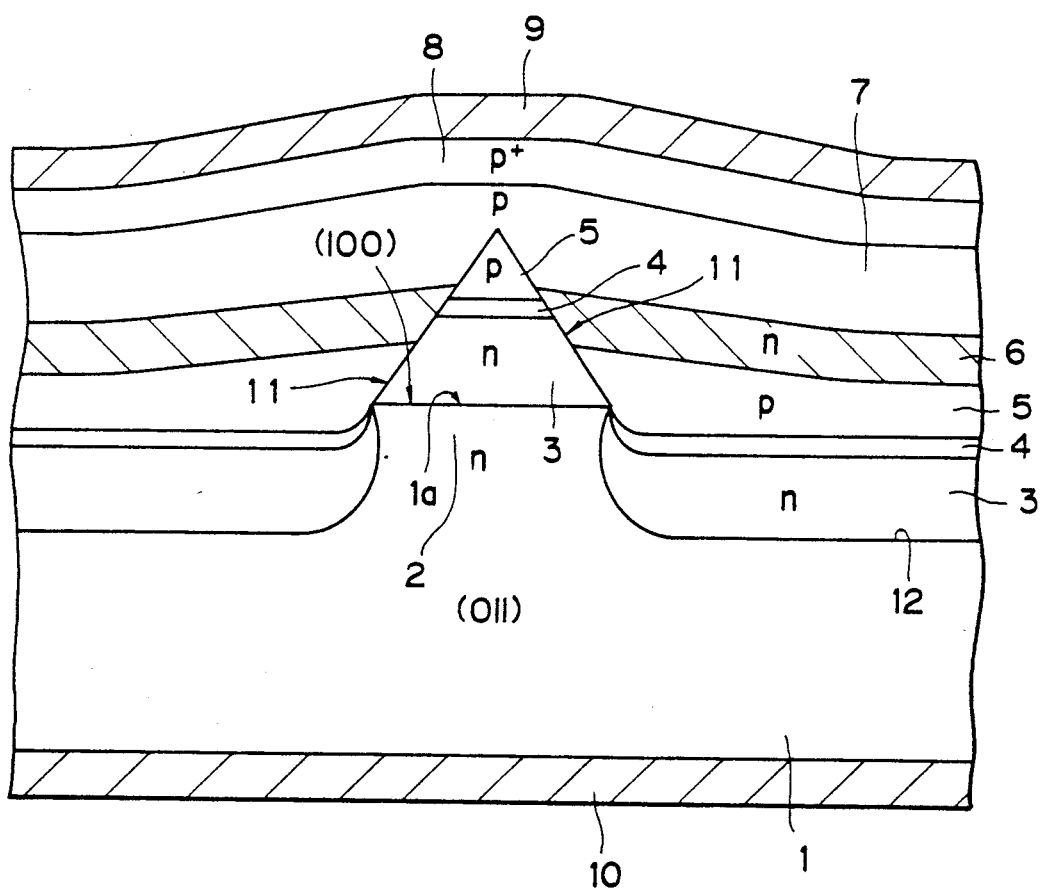
FIG. 16 is an enlarged, fragmentary, schematic sectional view of a semiconductor laser as a control.

The source gases of an AlGaAs group for forming the epitaxial layers by the MOCVD process may be trimethylgallium, trimethylaluminum and arsine (AsH$_3$), or triethylgallium, triethylaluminum and arsine. The source gases of the methyl group are preferable to form the epitaxial layers on the strip mesa naturally in the shape having a triangular cross section. In growing the crystals of an Al$_x$Ga$_{1-x}$As on the strip mesa 42, FIG. 15 is a graph showing the upper )limit of the growth rate g·r for the x representing the aluminum content of the Al$_x$Ga$_{1-x}$As in depositing the Al$_x$Ga$_{1-x}$As to form an epitaxial layer on the strip mesa 42 without forming oxides, i.e., defects. The upper limit of the growth rate g·r is represented by an expression g·r = $-20x + 13$. Values of the growth rate g·r for the x in the shaded area under the line expressed by g·r = $-20x + 13$ may be used for forming the epitaxial layer without forming oxides. Generally, $x \leq 0.45$, an appropriate growth rate g·r must not be higher than about 4 Å/sec.

In this embodiment, the relation between the x of the Al$_x$Ga$_{1-x}$As forming the n-type cladding layer 43, the first p-type cladding layer 45, the n-type current blocking layer 46 and the second p-type cladding layer 47, and the y of the A$_y$Ga$_{1-y}$As forming the active layer 44 meets an inequality: $x > y$. If necessary, an optical waveguide layer may be formed over the active layer 44 by the continuous MOCVD process. The respective types of conduction of those layers may be reversed.

This semiconductor laser manufacturing method is applicable to the epitaxisis of other mixed crystals containing aluminum as well as the epitaxisis of the foregoing materials.

Concrete examples of semiconductor lasers in accordance with the present invention and a semiconductor laser as a control will be described hereinafter. The semiconductor lasers in accordance with the present invention may be manufactured by any one of methods disclosed in Japanese Patent Laid-open (Kokai) No. 61-183987, and Japanese Patent Application Nos. 63-217829 and 63-330136 filed by the applicant of the present patent application.

EXAMPLE 1 (FIGS. 1, 2, 3)

A semiconductor laser of Example 1 is the same in construction as the semiconductor laser in the first embodiment shown in FIGS. 1 to 3, and is a semiconductor compound laser employing epitaxial layers formed of compounds of elements of the 111 and V, i.e., AlGaAs compounds.

The semiconductor laser employs a semiconductor substrate 2 of an n-type GaAs compound having a major surface 2a of the (100) crystal face. A strip mesa 1 having one or a plurality of expanded portions 1a as shown in FIG. 1 is formed on the major surface 2a of the semiconductor substrate 1 along the <011> crystallographic axis by a crystallographic etching process. In forming the strip mesa 1 a strip etching mask of an etching resist is formed optically on the major surface 2a of the semiconductor substrate 2 along the <011>crystallographic axis, and the major surface 2a is etched crystallographically by using the strip etching mask and a sulfuric acid etchant prepared by mixing 3 parts of $H_2SO_4$, 1 part of $H_2O_2$ and 1 part of $H_2O$. Then, functional semiconductor layers are formed sequentially over the major surface 2a of the semiconductor substrate 2 by a continuous MOCVD process. The functional semiconductor layers include an n-type fifth semiconductor layer 15 (an n type buffer layer of GaAs), an n-type first semiconductor layer 11 (a first cladding layer of Al$_x$Ga$_{1-x}$As), a second semiconductor layer 12 (an active layer of undoped Al$_y$Ga$_{1-y}$As), a p-type semiconductor layer 13 (a lower second p-type cladding layer), a fourth semiconductor layer 14 (a p- or n-type light absorbing layer of GaAs having a bandgap smaller than that of the second semiconductor layer 12 and a thickness not less than 0.1 pm), a p-type sixth semiconductor layer 16 (an upper second cladding layer of p-type Al$_x$Ga$_{1-x}$As), and a p-type seventh semiconductor layer 17 (a p-type cap layer having a small specific resistance.

When those functional layers are thus formed by epitaxial growth over the strip mesa 1 and recesses 8 formed on the opposite sides of the strip mesa 1 extending along the <011> crystallographic axis, faults 3 of the (111)B crystal face inclined at an angle θ of abut 55° to the top surface of the (100) crystal face of the strip mesa 1 are formed in the functional layers, because, once the (111)B crystal face is formed in the epitaxial layer grown on the strip mesa 1, the epitaxial growth rate of crystals on the (111)B crystal faces is a few tenth or less of the crystal growth rate on other crystal face, such as the (100) crystal face. Consequently, a laminated structure of the epitaxial layers having a triangular cross section is formed between the faults 3 on the strip mesa 1. The widths W$_1$ and W$_{p1}$ and the height of the strip mesa 1 are determined selectively so that a portion of the laminated structure of a triangular cross section formed between the inclined faults 3 on the portion of the width W$_1$ of the strip mesa 1 comprises only a strip buffer layer 9, i.e., a portion of the fifth semiconductor layer 15, a first strip cladding layer 21, i.e., a portion of the first semiconductor layer 11, a strip active layer 4, i.e., a portion of the second semiconductor layer 12, and a strip cladding layer 22, i.e., a portion of the third semiconductor layer 13, and the edges of portions of the fourth semiconductor layers 14 corresponding to the recesses 8 are contiguous respectively with the opposite side surfaces of the second strip cladding layer 22, and so that a portion of the laminated structure of the epitaxial layers formed between the inclined faults 3 on the expanded portion 1a of the width W$_{p1}$ of the strip mesa 1 comprises, in addition to the strip buffer layer 9, the first strip cladding layer 21, the strip active layer 4 and the second strip cladding layer 22, a strip light absorbing layer 5, i.e., a portion of the fourth semiconductor layer 14, and a strip upper second cladding layer 22u, i.e., a portion of the sixth semiconductor layer 16.

A seventh semiconductor layer 17 serving as a cap layer is formed across the strip mesa 11 over the entire surface of the laminated structure of the epitaxial layers formed on the semiconductor substrate 2. An electrode, not shown, is formed in ohmic contact over the entire surface of the seventh semiconductor layer 17 or over an area of the surface of the seventh semiconductor layer 17 corresponding to an elongate electrode window formed so as to correspond to the strip mesa 1 in an insulating layer formed over the seventh semiconductor layer 17.

The fourth semiconductor layer 14 forming the strip light absorbing layer 5 is formed of a semiconductor having a bandgap smaller than that of a semiconductor forming the second semiconductor layer 12 forming the strip active layer 4. The first semiconductor layer 11, the third semiconductor layer 13 and the sixth semiconductor layer 16 are formed of semiconductors each having a band gap greater than that of the semiconductor forming the second semiconductor layer 12. That is, in the AlGaAs compounds, $y<x$.

EXAMPLE 2 (FIGS. 4, 5, 6)

A semiconductor laser of Example 2 is the same in construction as that shown in FIGS. 4, 5 and 6, in which parts like or corresponding to those shown in FIGS. 1, 2 and 3 are denoted by the same reference characters and the description thereof will be omitted to avoid duplication. The semiconductor laser of Example 2 can be fabricated by same process as that applied to fabricating the semiconductor laser of Example 1.

The semiconductor laser of Example 2 employs a semiconductor substrate 2 having a strip mesa 1 of a desired width $W_2$ including a contracted portion 1b of a width $W_{p2}$ smaller than the width $W_2$. The strip mesa 1 may be provided with one contracted portion 1b as shown in FIG. 4 or a plurality of such contracted portions 1b. The fourth semiconductor layer 14 serving as a current blocking layer 6 is formed of an n-type (first conduction type) AlGaAs.

The height and widths $W_2$ and $W_{p2}$ of the strip mesa 1 are determined selectively so that a strip buffer layer 9, i.e., a portion of the fifth semiconductor layer 15, a first strip cladding layer 21, i.e., a portion of the first semiconductor layer 11, and a strip active layer 4, i.e., a portion of the second semiconductor layer 12 are formed over the entire length of the strip mesa 1 between the faults 3, a portion of the laminated structure of the epitaxial layers formed over the portion of the desired width $W_2$ of the strip mesa 1 includes a second strip cladding layer 22, i.e., a portion of the third semiconductor layer 13 formed on the strip active layer 4 as shown in FIG. 5, a portion of the laminated structure of the epitaxial layers formed over the contracted portion 1b of the width $W_{p2}$ of the strip mesa 1 does not include the second strip cladding layer 22, i.e., a portion of the third semiconductor layer 13 as shown in FIG. 6, the edges 14a and 14b of portions of the fourth semiconductor layer 14 corresponding to the recesses 8 are contiguous respectively with the opposite side surfaces 4a and 4b of the strip active layer 4 in the portion of the laminated structure of the epitaxial layers defined by the faults 3 on the portion of the width $W_2$ of the strip mesa 1 as shown in FIG. 5, and a current blocking layer 6, i.e., a portion of the fourth semiconductor layer 14 is in direct contact with the strip active layer 4 in the portion of the laminated structure of the epitaxial layers on the contracted portion 1b of the strip mesa 1 as shown in FIG. 6.

EXAMPLE 3 (FIGS. 7, 8, 9)

A semiconductor laser of Example 3 is the same in construction as that shown in FIGS. 7, 8 and 9, in which parts like or corresponding to those shown in FIGS. 1 to 6 are denoted by the same reference characters and the description thereof will be omitted to avoid duplication. The semiconductor laser of Example 3 may be fabricated by the same method as that applied to fabricating the semiconductor laser of Example 1.

The semiconductor laser of Example 3 employs a semiconductor substrate having a strip mesa 1 of a desired width $W_3$ provided with an expanded portion 1c of a width $W_{p3}$ as shown in FIG. 7 or a plurality of such expanded portions 1c. The fourth semiconductor layer 14 forming the strip current block layer, similarly to that of the Example 2, is formed of an n-type (first conduction type) AlGaAs.

The height and widths $W_3$ and $W_{p3}$ of the strip mesa 1 are determined selectively so that a laminated structure of the epitaxial layers comprising the strip buffer layer 9, i.e., a portion of the fifth semiconductor layer 15, the first strip cladding layer 21, i.e., a portion of the first semiconductor layer 11, the strip active layer 4, i.e., a portion of the second semiconductor layer 12, and the second strip cladding layer 22, i.e., a portion of the third semiconductor layer 13 are formed over the entire length of the strip mesa 1 between the faults 3, a portion of the laminated structure of the epitaxial layers corresponding to the expanded portion 1c of the width $W_{p3}$ includes, in addition to the strip buffer layer 9, the first strip cladding layer 21, the strip active layer 4 and the second strip cladding layer 22, the strip current blocking layer 6, i.e., a portion of the fourth semiconductor layer 14 as shown in FIG. 9, and the edges 14a and 14b of portions of the fourth semiconductor layer 14 corresponding to the recesses 8 are contiguous respectively with the opposite side surfaces 4a and 4b of the strip active layer 4 in the portion of the laminated structure of the epitaxial layers defined by the faults 3 on the portion of the strip mesa 1.

EXAMPLE 4 (FIGS. 10, 11, 12, 13)

A semiconductor laser of Example 4 is the same in construction as that shown in FIGS. 10 to 13, in which parts like or corresponding to those shown in FIGS. 1 to 9 are denoted by the same reference characters and the description thereof will be omitted to avoid duplication. The semiconductor laser of Example 4 may be fabricated by the same method as that applied to fabricating the semiconductor laser of Example 1.

The semiconductor laser of Example 4 employs a semiconductor substrate having a strip mesa 1 of a desired width $W_4$, and a pair of auxiliary strip mesas 7a and 7b having a height lower than that of the strip mesa 1 and extending respectively on the opposite sides of a substantially middle portion of the strip mesa 1 as shown in FIG. 10 or a plurality of pairs of such auxiliary strip mesas 7a and 7b. The fourth semiconductor 14 serving as a light absorbing layer or a current absorbing layer 56 is formed of an n-type (first conduction type) AlGaAs.

Figure 13:
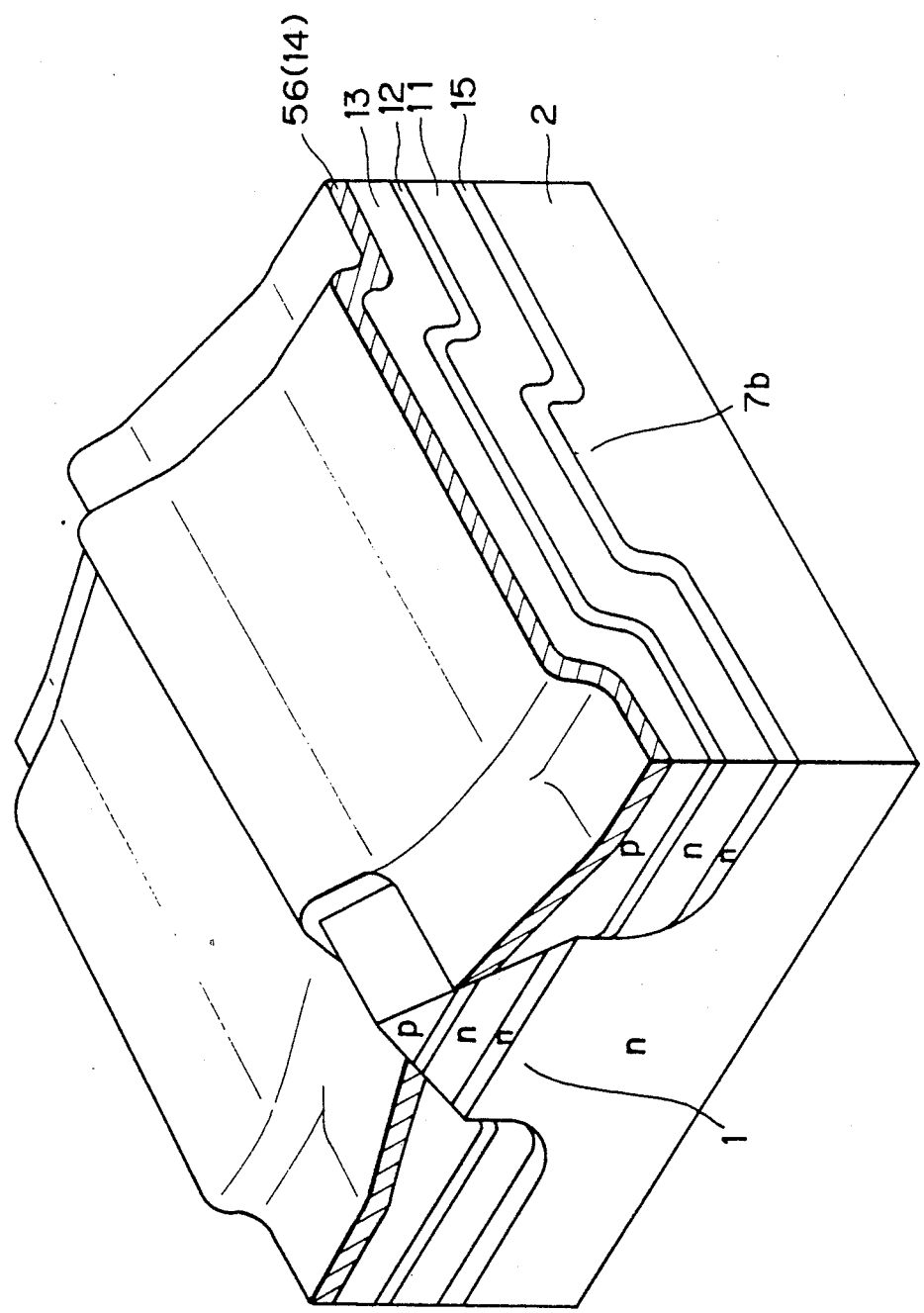
FIG. 13 is an enlarged perspective view of an essential portion of FIG. 10.

The heights and widths $W_4$ and $W_{p4}$ of the strip mesa 1 and the auxiliary strip mesas 7a and 7b are determined selectively so that laminated structure of the epitaxial layers defined by the faults 3 and comprising the strip buffer layer 9, i.e., a portion of the fifth semiconductor layer 15, the first strip cladding layer 21, i.e., a portion of the first semiconductor layer 11, a strip active layer 4, i.e., a portion of the second semiconductor layer 12 and the second strip cladding layer 22, i.e., a portion of the third semiconductor layer 13, is formed over the entire length of the strip mesa 1, and the edges 14a and 14b of portions of the fourth semiconductor layer 14 corresponding to the recesses 8 are contiguous respectively with the opposite side surfaces 4a and 4b of the strip active layer 4 in the portion of the laminated structure of the epitaxial layers defined by the faults 3 on a portion of the strip mesa 1 other than a portion of the same between the auxiliary strip mesas 7a and 7b as shown in FIG. 11. Since the depth of the recesses 8 in areas including the auxiliary strip mesas 7a and 7b is decreased, portions of the fourth semiconductor layer 14 corresponding to the auxiliary strip mesas 7a and 7b are raised accordingly as shown in FIGS. 12 and 13, and, consequently, the light absorbing or current blocking layer 56, i.e., a portion of the fourth semiconductor layer 14, corresponding to the auxiliary strip mesas 7a and 7b extends across the portion of the strip mesa 1 between the auxiliary strip mesas 7a and 7b.

Although the invention has been described in its preferred forms with a certain degree of particularity, obviously many changes and variations are possible therein. It is therefore to be understood that the present invention may be practiced otherwise than as specifically described herein without departing from the scope and spirit thereof.

What is claimed is:

1. In a semiconductor laser comprising:
    a semiconductor substrate provided in its major surface with a strip mesa of a desired width having an expanded portion; and
    a laminated structure constructed on the major surface of the semiconductor substrate by sequentially forming by epitaxisis at least a first semiconductor layer serving as a first conduction type cladding layer, a second semiconductor layer serving as an active layer, a third semiconductor layer serving as a second conduction type cladding layer, and a fourth semiconductor layer serving as a light absorbing layer;
    characterized in that;
    faults are formed in the laminated structure along the direction of extension of the opposite longitudinal side surfaces of the strip mesa;
    the second semiconductor layer is split by the faults so that a portion of the second semiconductor forms a strip active layer between the faults in a portion of the laminated structure extending on the strip mesa;
    the fourth semiconductor layer of the laminated structure is split by the faults so that the fourth semiconductor layer 14 is not included in a portion of the laminated structure corresponding to a portion of the desired width of the strip mesa; and
    a portion of the fourth semiconductor layer serving as a light absorbing layer is formed over the active layer in a portion of the laminated structure corresponding to the expanded portion of the strip mesa.

2. In a semiconductor laser comprising:
    a semiconductor substrate provided in its major surface with a strip mesa of a desired width having a contracted portion; and
    a laminated structure constructed on the major surface of the semiconductor substrate by sequentially forming by epitaxisis at least a first semiconductor layer serving as a first conduction type cladding layer, a second semiconductor layer serving as an active layer, a third semiconductor layer serving as a second conduction type cladding layer, and a fourth semiconductor layer serving as a first conduction type current blocking layer;
    characterized in that:
    faults are formed in the laminated structure along the direction of extension of the opposite longitudinal side surfaces of the strip mesa;
    the second semiconductor layer is split by the faults so that a portion of the second semiconductor layer forms a strip active layer between the faults in a portion of the laminated structure extending on the strip mesa;
    the fourth semiconductor layer is split by the faults so that the fourth semiconductor layer is not included in a portion of the laminated structure corresponding to a portion of the desired width of the strip mesa; and
    the fourth semiconductor layer extends, as a current blocking layer over and across the active layer of a portion of the laminated structure corresponding to the contracted portion of the strip mesa;

3. In a semiconductor laser comprising:
    a semiconductor substrate provided in its major surface with a strip mesa of a desired width having an expanded portion; and
    a laminated structure constructed on the major surface of the semiconductor substrate by sequentially forming by epitaxisis at least a first semiconductor layer serving as a first conduction type cladding layer, a second semiconductor layer serving as an active layer, a third semiconductor layer serving as a second conduction type cladding layer, and a fourth semiconductor layer serving as a first conduction type current blocking layer;
    characterized in that:
    faults are formed in the laminated structure along the direction of extension of the opposite longitudinal side surfaces of the strip mesa;
    the second semiconductor layer is split by the faults so that a portion of the second semiconductor layer forms a strip active layer between the faults in a portion of the laminated structure extending on the strip mesa;
    the fourth semiconductor layer is split by the faults so that the edges of portions of the fourth semiconductor layer are contiguous with the side edges or the vicinities of the side edges of the strip active layer in the portion of the laminated structure extending on the strip mesa between the faults;
    the fourth semiconductor layer is not included in a portion of the laminated structure corresponding to a portion of the desired width of the strip mesa; and
    a portion of the fourth semiconductor layer is formed locally on a portion of the third semiconductor layer formed over the strip active layer included in a portion of the laminated structure corresponding to the expanded portion of the strip mesa.

4. In a semiconductor laser comprising:
    a semiconductor substrate provided in its major surface with a strip mesa and auxiliary strip mesa having a height lower than that of the strip mesa and extended respectively on the opposite sides of a portion of the strip mesa; and
    a laminated structure constructed on the major surface of the semiconductor substrate by sequentially forming by epitaxisis at least a first semiconductor layer serving as a first conduction type cladding layer, a second semiconductor layer serving as an active layer, a third semiconductor layer serving as a second conduction type cladding layer, and a fourth semiconductor layer serving as a light absorbing layer;
    characterized in that:

faults are formed in the laminated structure along the direction of extension of the opposite longitudinal side surfaces of the strip mesa;

the second semiconductor layer is split by the faults so that a portion of the second semiconductor layer forms a strip active layer between the faults in a portion of the laminated structure extending on the strip mesa;

the fourth semiconductor layer is split by the faults so that the fourth semiconductor layer is not included in a portion of the laminated structure other than the portion of the same formed on the portion between the auxiliary strip mesas; and a portion of the fourth semiconductor layer included in a portion of the laminated structure formed on the portion of the strip mesa between the auxiliary strip mesas extends across the portion of the strip mesa between the auxiliary strip mesas and opposite to the strip active layer.

5. In a semiconductor laser comprising:

a semiconductor substrate provided in its major surface with a strip mesa and auxiliary strip mesa having a height lower than that of the strip mesa and extended respectively on the opposite sides of a portion of the strip mesa; and a laminated structure constructed on the major surface of the semiconductor substrate by sequentially forming by epitaxisis at least a first conductor layer serving as a first conduction type cladding layer, a second semiconductor layer serving as an active layer, a third semiconductor layer serving as a second conduction type cladding layer, and a fourth semiconductor layer serving as a current blocking layer;

characterized in that:

faults are formed in the laminated structure along the direction of extension of the opposite longitudinal side surfaces of the strip mesa;

the second semiconductor layer is split by the faults so that a portion of the second semiconductor layer forms a strip active layer between the faults in a portion of the laminated structure extending on the strip mesa;

the fourth semiconductor layer is split by the faults so that the fourth semiconductor layer is not included in a portion of the laminated structure other than the portion of the same formed on the portion between the auxiliary strip mesas; and a portion of the fourth semiconductor layer included in a portion of the laminated structure formed on the portion of the strip mesa between the auxiliary strip mesas extends across the portion of the strip mesa between the auxiliary strip mesas and opposite to the strip active layer.

* * * * *